(12) United States Patent
Muramatsu et al.

(10) Patent No.: US 7,088,195 B2
(45) Date of Patent: Aug. 8, 2006

(54) VOLTAGE CONTROLLED OSCILLATOR HAVING VARACTOR AND TRANSISTOR REGIONS UNDERLYING SPIRAL CONDUCTORS

(75) Inventors: Yoshinori Muramatsu, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/863,389

(22) Filed: Jun. 9, 2004

(65) Prior Publication Data
US 2004/0251978 A1    Dec. 16, 2004

(30) Foreign Application Priority Data
Jun. 13, 2003    (JP) .............................. 2003-169038

(51) Int. Cl.
*H03B 5/08*    (2006.01)

(52) U.S. Cl. .............................. 331/117 R; 331/117 FE

(58) Field of Classification Search ............ 331/117 R, 331/117 FE
See application file for complete search history.

(56) References Cited

U.S. PATENT DOCUMENTS

| 5,912,596 A * | 6/1999 | Ghoshal ................. 331/117 R |
| 5,952,893 A * | 9/1999 | Ghoshal ................. 331/108 C |
| 2004/0183606 A1* | 9/2004 | Komurasaki et al. ... 331/117 R |

FOREIGN PATENT DOCUMENTS

JP    2002-9299    1/2002

OTHER PUBLICATIONS

Ali Hajimiri, et al., "Design Issues in CMOS Differential LC Oscillators", IEEE Journal of Solid-State Circuit, vol. 34, No. 5, May 1999, pp. 717-724.

* cited by examiner

*Primary Examiner*—Joseph Chang
(74) *Attorney, Agent, or Firm*—McGinn IP Law Group, PLLC

(57) ABSTRACT

An LC-VCO in which two spiral inductors are provided in layers of a multilayer interconnection layer, while varactor elements and N-channel transistors are positioned in an region underlying the two spiral inductors, the region excluding the center axes of the spiral inductors. This allows use of a reduced layout area for the LC-VCO, while preventing magnetic fields created by the spiral inductors from having adverse effects on the operation of the varactor elements and the N-channel transistors.

22 Claims, 5 Drawing Sheets

VOLTAGE CONTROLLED OSCILLATOR HAVING VARACTOR AND TRANSISTOR REGIONS UNDERLYING SPIRAL CONDUCTORS

BACKGROUND OF THE INVENTION

1. Field of the Invention

The present invention relates to a voltage controlled oscillator which utilizes the resonance of parallel-LC tank circuits and more particularly to a voltage controlled oscillator that is preferably used as a local oscillator in a phase locked loop circuit.

2. Description of the Related Art

Conventionally, ring-voltage controlled oscillators (R-VCO) have been used as a local oscillator (LO) in a phase locked loop (PLL) circuit that is employed for frequency multiplication and phase synchronization. The R-VCO has an odd number of CMOS (Complementary Metal Oxide Semiconductor) inverters that are annually coupled to each other. This configuration provides an advantage that the R-VCO can be incorporated into a MOS integrated circuit. However, the R-VCO has disadvantages of high jitter and high phase noise.

On the other hand, the voltage controlled oscillator utilizing the resonance of a parallel-LC tank circuit (LC-VCO) has been recently used as a local oscillator. The LC-VCO includes inductors and variable capacitors which are coupled in parallel to each other to form a parallel-LC tank circuit. The resonance of the parallel-LC tank circuit causes an AC signal to be delivered at a resonant frequency. A resonant frequency is a frequency at which the reactance of a parallel-LC tank circuit is infinite, and the resonance refers to a phenomenon in which a current flows alternately through the inductors and variable capacitors in a parallel-LC tank circuit. The variable capacitor is a varactor element or the like, the capacitance of which varies with a control voltage applied thereto. The capacitance of the variable capacitor is adjusted to thereby control the frequency of the oscillating AC signal. For example, such an LC-VCO is disclosed in the literature, Ali Hajimira and Thomas H. Lee, "Design Issues in CMOS Differential LC Oscillators", IEEE JOURNAL OF SOLID-STATE CIRCUIT, Vol. 34, No. 5 (MAY 1999).

The LC-VCO has the following advantages over the R-VCO. First, the LC-VCO has a lower noise level as compared with the R-VCO. This feature derives from the fact that the LC-VCO includes a less number of transistors which may cause noise because it is primarily based on the resonance of a parallel-LC tank circuit. This feature thus allows the LC-VCO to be preferably incorporated into high-speed optical telecommunications devices, cellular phones, wireless LANs or the like.

Secondly, the LC-VCO can easily provide higher oscillation frequencies than the R-VCO. This is because the LC-VCO is primarily based on the resonance of a parallel-LC tank circuit, whereas the R-VCO is made up of transistors and utilizes their logic gate delays.

Thirdly, the LC-VCO has a smaller range of variations in oscillation frequency for a control voltage as compared with the R-VCO. This feature allows for a lower tuning sensitivity and less variations in oscillation frequency caused by variations in control voltage, resulting in low noise.

FIG. 1 is a circuit diagram showing a conventional LC-VCO, and FIG. 2 is a plan view showing the conventional LC-VCO. As shown in FIG. 1, the conventional LC-VCO 101 is connected to a supply potential line VCC and a ground potential line GND. An inductor section 2, a variable capacitor section 3, a negative resistance section 4, and a current regulation section 5 are connected with one another in that order from the supply potential line VCC towards the ground potential line GND in the LC-VCO 101.

The inductor section 2 is provided with two spiral inductors 6a and 6b. Ends of the spiral inductor 6a and 6b are connected to the supply potential line VCC, with the other ends being connected to output terminals 7a and 7b, respectively.

The variable capacitor section 3 is provided with two varactor elements 8a and 8b. One end of the varactor element 8a, e.g., a well electrode is connected to the output terminal 7a, while one end of the varactor element 8b, e.g., a well electrode is connected to the output terminal 7b. The varactor elements 8a and 8b are connected to each other at the other ends thereof, e.g., the gate electrodes, to which a control voltage is applied.

The negative resistance section 4 is provided with N-channel transistors 9a and 9b. The N-channel transistor 9a has the drain connected to the output terminal 7a and the gate connected to the output terminal 7b. On the other hand, the N-channel transistor 9b has the drain connected to the output terminal 7b and the gate connected to the output terminal 7a.

The current regulation section 5 is provided with an N-channel transistor 10, with the drain of the N-channel transistor 10 connected to the sources of the N-channel transistor 9a and the N-channel transistor 9b. Additionally, the N-channel transistor 10 has the source connected to the ground potential line GND and the gate to which a bias voltage is applied.

Now, a layout of the conventional LC-VCO 101 will be described below. As shown in FIG. 2, the LC-VCO 101 is provided in a semiconductor integrated circuit device in which multilayer interconnection layer 12 are deposited on a semiconductor substrate (not shown). The spiral inductors 6a and 6b are deposited in the topmost layers of the multilayer interconnection layer 12, respectively. A varactor element formed region in which the varactor elements 8a and 8b are to be formed and a transistor formed region in which the N-channel transistors 9a, 9b, and 10 are to be formed are located out of the underlying region of the spiral inductors 6a and 6b on the surface of the semiconductor substrate. On the other hand, no other elements nor conductors such as wirings are formed in the underlying region of the spiral inductors 6a and 6b.

In this manner, the conventional LC-VCO layout is designed such that the spiral inductors are deposited in the topmost layers of the multilayer interconnection layer, with no elements such as varactor elements or transistors nor conductors being deposited in the underlying region of the spiral inductors. This design is intended to prevent magnetic fields created in the spiral inductors from having an adverse effect on the operation of active elements or from inducing a current flowing through conductors to cause power loss. Such an LC-VCO having a layout of this type is disclosed in the aforementioned literature and Japanese Patent Laid-Open Publication No. 2002-9299.

However, the aforementioned prior art technique has the following problems. That is, the conventional LC-VCO has a larger layout area than the R-VCO. For example, the R-VCO may have a layout of a rectangular area with a 75 μm vertical side and a 150 μm horizontal side, whereas the conventional LC-VCO 101 has a layout of a rectangular area with a 250 μm vertical side and a 300 μm horizontal side, being about seven times the R-VCO in layout area.

SUMMARY OF THE INVENTION

It is an object of the present invention to provide a voltage controlled oscillator which has good characteristics with a reduced layout area.

The present invention provides a voltage controlled oscillator which is incorporated into a semiconductor integrated circuit device that includes a substrate and multilayer interconnection layer deposited on the substrate. The voltage controlled oscillator includes output terminals, spiral inductors deposited in the multilayer interconnection layer and connected to the output terminals, variable capacitors, and a negative resistance section. In this configuration, the variable capacitors are formed in a region which includes the underlying region of the spiral inductors but does not include the center axes of the spiral inductors, and connected in parallel to the spiral inductors to form a resonant circuit in conjunction therewith. The negative resistance section is formed in the region. And, the negative resistance section is connected between the resonant circuit and a power supply to supply currents to the resonant circuit in sync with a resonant signal produced by the resonant circuit.

According to the present invention, the resonant circuit made up of the spiral inductors and the variable capacitors is supplied with a current from the negative resistance section connected to the power supply, thereby allowing an AC signal to be delivered from the output terminals at a frequency equal to the resonant frequency of the resonant circuit. The variable capacitors and the negative resistance section are formed in a region including the underlying region of the spiral inductors, thereby providing a reduced layout area for the voltage controlled oscillator. Additionally, the variable capacitors and the negative resistance section are formed in the region which does not include the center axes of the spiral inductors, thereby preventing magnetic fields created by the spiral inductors from having effects on the operation of the variable capacitors and the negative resistance section. It is also possible to prevent the efficiency of the spiral inductors from being reduced due to a current being induced. This allows for providing a voltage controlled oscillator which has a reduced layout area with good characteristics.

On the other hand, the spiral inductors may be a full-symmetric inductor. This makes it possible to provide a further reduced layout area for the voltage controlled oscillator.

According to the present invention, the variable capacitors and the negative resistance section are formed in the region which includes the underlying region of the spiral inductors but does not include their center axes, thereby providing a reduced layout area without degradation in the characteristics of the voltage controlled oscillator. This allows a semiconductor integrated circuit device incorporating this voltage controlled oscillator to be reduced in size and more densely populated.

DETAILED DESCRIPTION OF THE PREFERRED EMBODIMENTS

Figure 3:
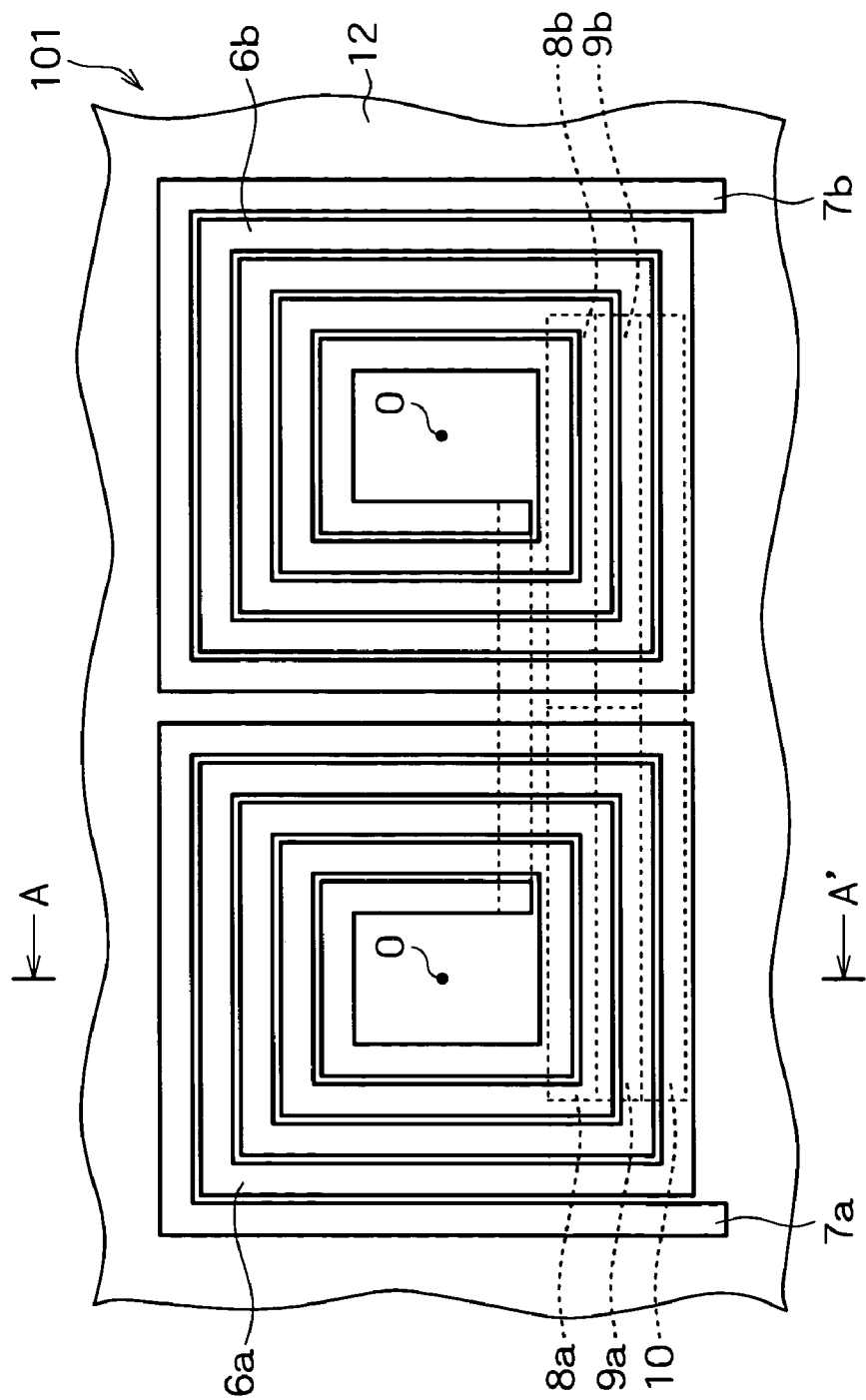
FIG. 3 is a plan view showing a voltage controlled oscillator according to a first embodiment of the present invention.

Now, the present invention will be described below more specifically with reference to the accompanying drawings in accordance with the embodiments. First, a first embodiment of the present invention will be described below. FIG. 3 is a plan view showing a voltage controlled oscillator (LC-VCO) according to this embodiment, FIG. 4 is a sectional view taken along the line A–A' of FIG. 3.

Figure 1:
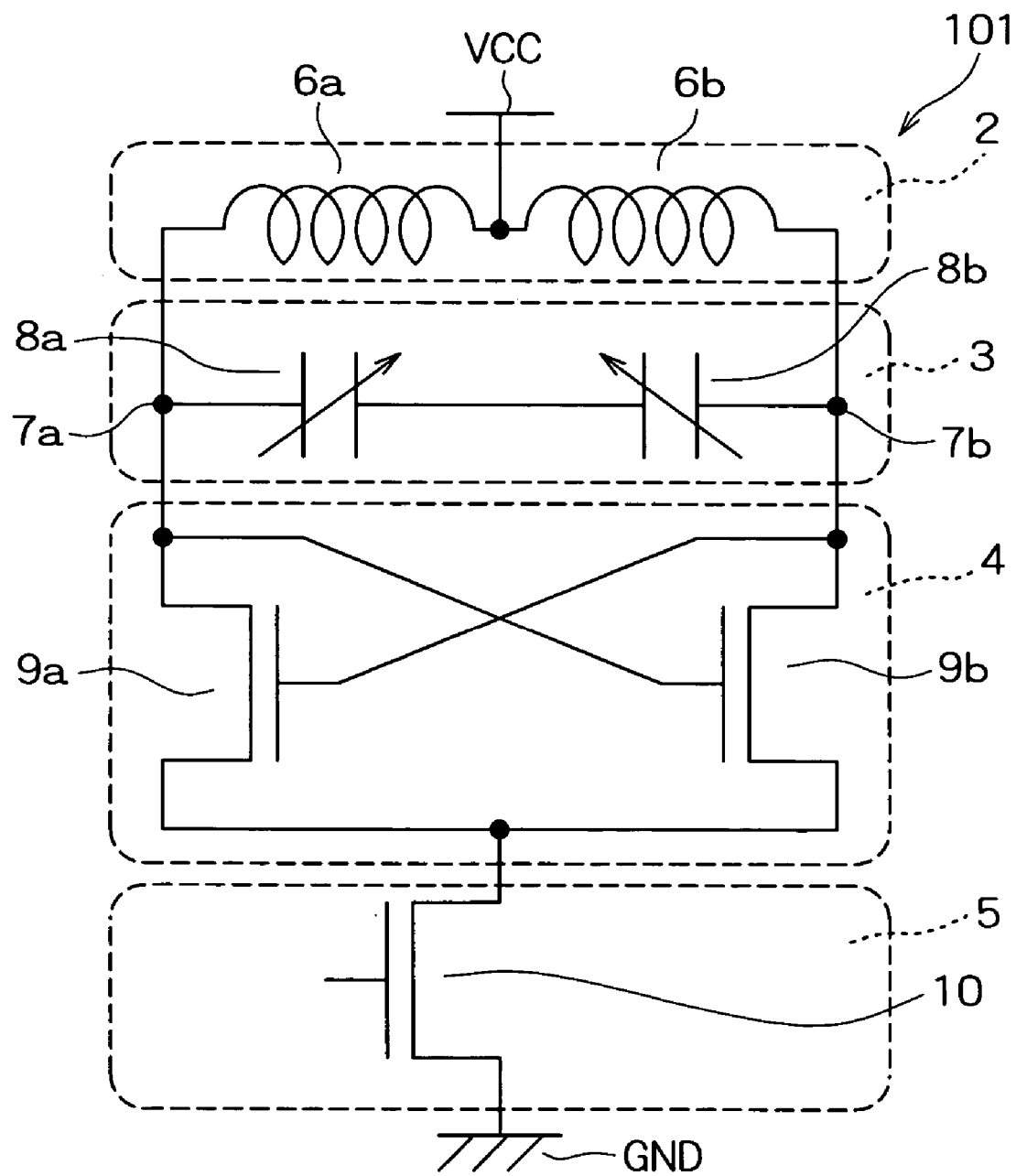
FIG. 1 is a circuit diagram showing a conventional LC-VCO.
Figure 2:
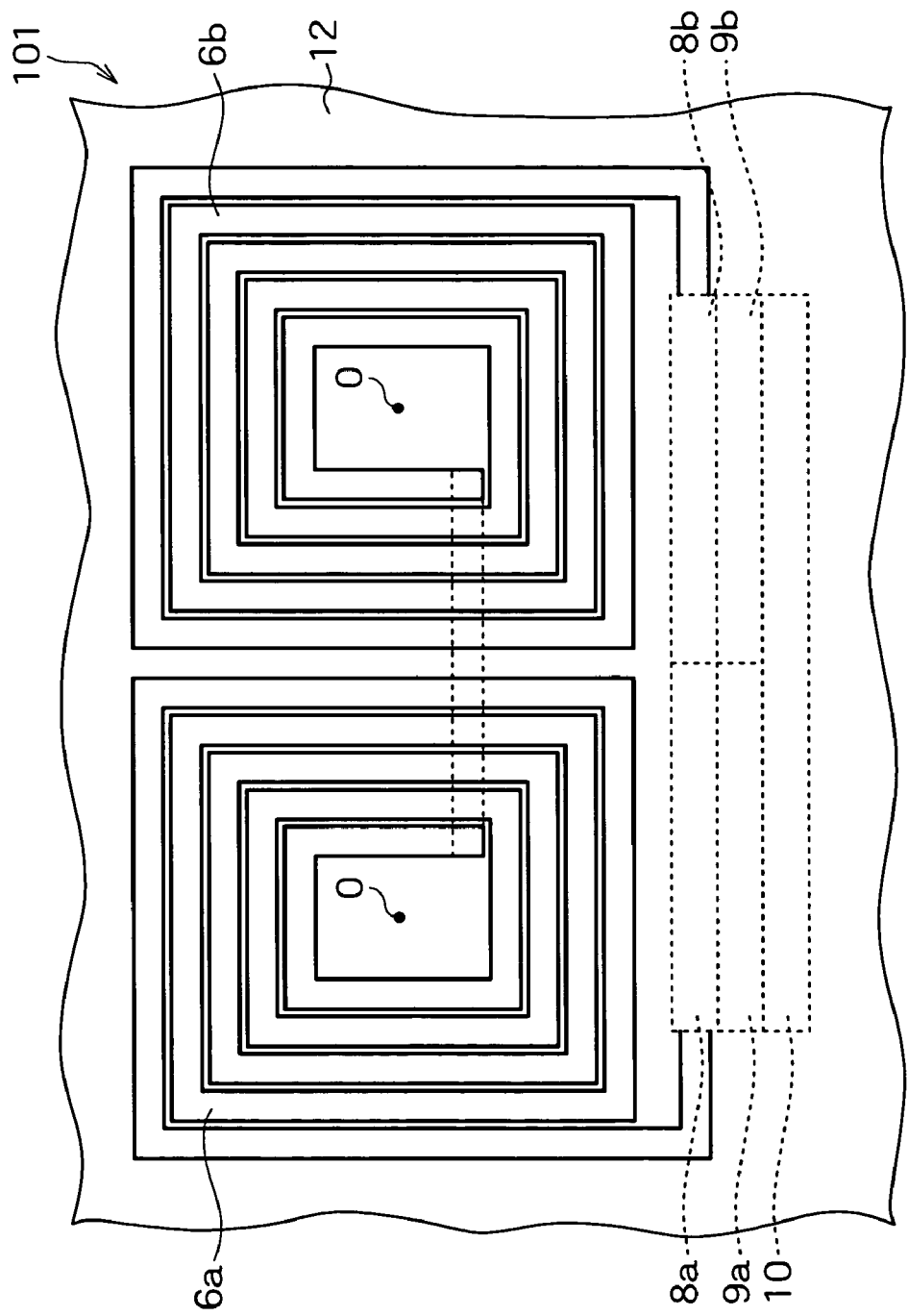
FIG. 2 is a plan view showing the conventional LC-VCO.
Figure 4:
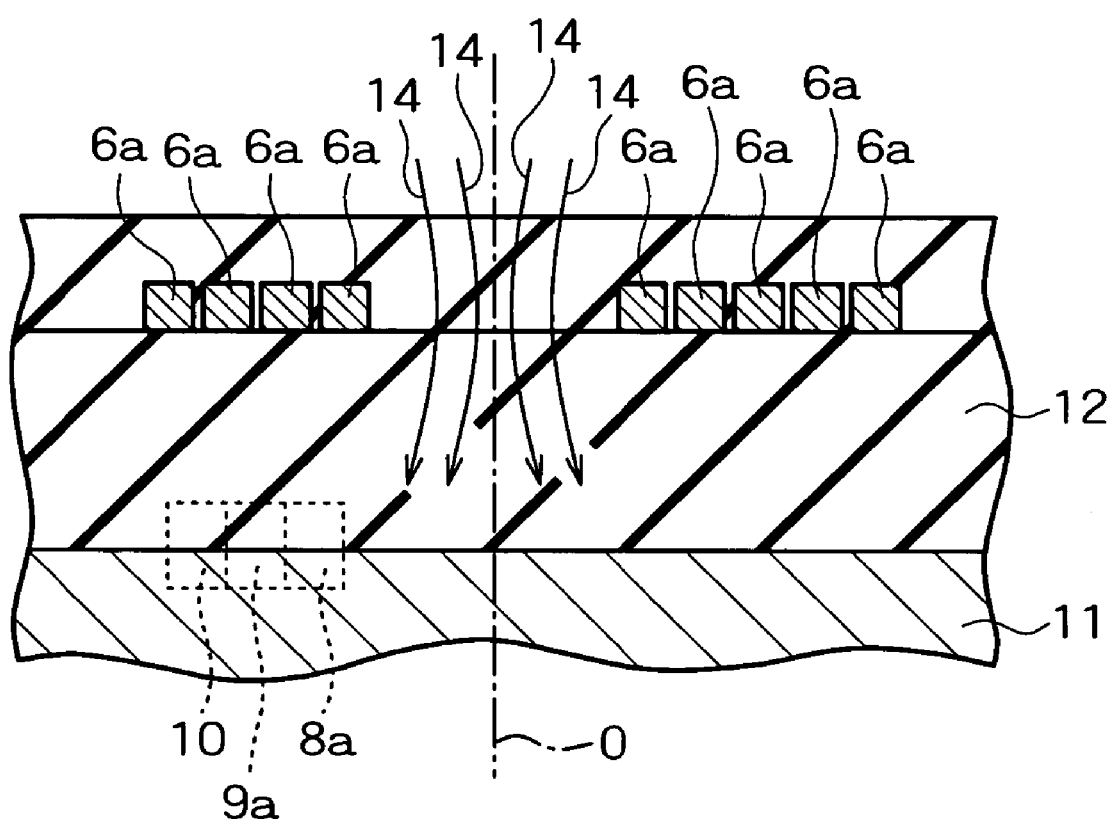
FIG. 4 is a sectional view taken along the line A–A' of FIG. 3.

As shown in FIGS. 3 and 4, the LC-VCO 1 according to this embodiment has a layout different from that of the aforementioned conventional LC-VCO 101 (see FIG. 2). The circuit configuration of the LC-VCO 1 of this embodiment is identical to that of the conventional LC-VCO 101 shown in FIG. 1. The LC-VCO 1 according to this embodiment is a local oscillator for use with a phase locked loop circuit.

As shown in FIGS. 3 and 4, the LC-VCO 1 is incorporated into a semiconductor integrated circuit device in which the multilayer interconnection layer 12 is formed on a semiconductor substrate 11. The spiral inductors 6a and 6b are deposited in the topmost layers of the multilayer interconnection layer 12, respectively. For example, each of the spiral inductors 6a and 6b is an inductor having five turns of a conductor trace formed in rectangular shapes.

The varactor element formed region in which the varactor element 8a is deposited is positioned in the underlying region of the spiral inductor 6a on the surface of the semiconductor substrate, the region excluding the center axis O of the spiral inductor 6a. As described above, the varactor element 8a is connected to the spiral inductor 6a. Additionally, the transistor formed region in which the N-channel transistor 9a is formed is positioned adjacent to the varactor element formed region. The transistor formed region is also positioned in the underlying region of the spiral inductor 6a, the region excluding the center axis O of the spiral inductor 6a.

The center of the spiral inductor 6a refers to the point of intersection of two diagonal lines that each connects two diagonal corners of the rectangles formed by the turns of the conductor trace. In the case of a spiral inductor of turns of a conductor trace formed in annular shapes, the center of the annular rings is the center of the spiral inductor.

Likewise, the varactor element formed region in which the varactor element 8b is formed and the transistor formed region in which the N-channel transistor 9b is formed are positioned in a region which includes the underlying region of the spiral inductor 6b on the surface of the semiconductor substrate but does not include the center axis of the spiral inductor 6b.

Furthermore, the transistor formed region in which the N-channel transistor 10 is formed is also positioned in a region which includes the underlying region of the spiral inductors 6a and 6b but does not include the center axes of the spiral inductors 6a and 6b. Still furthermore, the wirings for connecting between the aforementioned elements and those for connecting between other elements in the semiconductor integrated circuit device are also positioned in a region which does not include the center axes O of the spiral inductors 6a and 6b. Accordingly, in this semiconductor integrated circuit device, the center axes O of the spiral inductors 6a and 6b are designed to go through only interlayer insulating layers of the multilayer interconnection layer and the semiconductor substrate 11.

Now, referring to FIGS. 3 and 4, the operation of the LC-VCO 1 will be described below. First, a bias voltage is applied to the gate of the N-channel transistor 10. This causes the N-channel transistor 10 to reach a level of saturation of its I–V property, in the case of which a drain current that is defined by a gate voltage and does not depend on a drain voltage flows between the source and the drain. As a result, with a bias voltage being fixed to a certain value, a constant current is allowed to flow through the LC-VCO 1 irrespective of the potential difference between the source and drain of the N-channel transistor 10.

Under this condition, suppose that the LC-VCO 1 is connected to the supply potential line VCC and the ground potential line GND. In this case, with some electric stimulus being applied to the LC resonant circuit having the inductor section 2 and the variable capacitor section 3, the LC resonant circuit delivers a complementary resonant signal from the output terminals 7a and 7b.

However, using only the LC resonant circuit would cause loss due to parasitic resistance, resulting in the oscillation being terminated sooner or later. To address this situation, a positive supply potential is applied to the supply potential line VCC and a ground potential is applied to the ground potential line GND to supply a current to the LC-VCO 1, while the negative resistance section 4 is provided. This allows the LC resonant circuit to deliver a resonant signal permanently.

That is, for example, with the output terminal 7a being at a low level and the output terminal 7b at a high level, the N-channel transistor 9a is turned on. As a result, both the supply potential and the ground potential are applied to the output terminal 7a, resulting in the output terminal 7a being at a potential intermediate therebetween. On the other hand, since the N-channel transistor 9b is turned off, the supply potential is applied to the output terminal 7b. Likewise, with the output terminal 7a being at a high level and the output terminal 7b being at a low level, the supply potential is applied to the output terminal 7a while both the supply potential and the ground potential are applied to the output terminal 7b, resulting in the output terminal 7b being at a potential intermediate therebetween. This allows the oscillation delivered from the output terminals 7a and 7b to be maintained without attenuation.

Then, changes of the control voltage to be applied to the gate electrodes of the varactor elements 8a and 8b cause the capacitance of the varactor elements 8a and 8b to vary. As a result, the LC resonant circuit changes its resonant frequency in response to the control voltage, thereby allowing the frequency of the AC signal delivered by the LC-VCO 1 to vary.

At this time, as shown in FIG. 4, the spiral inductors 6a and 6b produce a magnetic field. However, magnetic force lines 14 concentrate in the vicinity of the center axes O of the spiral inductors 6a and 6b. The LC-VCO 1 according to this embodiment has the varactor elements 8a and 8b and the N-channel transistors 9a, 9b, and 10 formed in a region that does not include the center axes O. This prevents the magnetic field produced by the spiral inductors 6a and 6b from having substantial adverse effects on the operation of the varactor elements 8a and 8b, and the N-channel transistors 9a, 9b, and 10. Furthermore, no conductors such as wirings are also located in the region that intersects the center axes O, thereby causing almost no loss due to induced currents.

As described above, this embodiment allows the magnetic fields produced by the spiral inductors to have no adverse effects on the varactor elements and the transistors. Furthermore, in this embodiment, since the varactor elements and transistors are formed in the underlying region of the spiral inductors, the LC-VCO 1 is approximately equal in layout area to the spiral inductors and thus provided with a reduced layout area as compared with the conventional LC-VCO. For example, the LC-VCO 1 according to this embodiment has a rectangular layout area of a 150 µm vertical side and a 300 µm horizontal side, which is thus 0.6 times the layout area of the conventional LC-VCO 101 (see FIG. 2). As a result, the entire semiconductor integrated circuit device incorporating the LC-VCO 1 according to this embodiment is reduced in size and more densely populated.

In this embodiment, only the varactor elements 8a and 8b and the N-channel transistors 9a, 9b, and 10 are shown as the elements other than the spiral inductors in the LC-VCO 1. However, the LC-VCO according to the present invention may include other elements than those mentioned above. For example, invariable capacitors having a fixed capacitance can also be connected in parallel to the varactor elements 8a and 8b between the output terminals 7a and 7b. Furthermore, for example, resistors may also be connected between the supply potential line VCC and the output terminals 7a and 7b. In this case, the elements other than the spiral inductors are located in a region which includes the underlying region of the spiral inductors but does not include the center axes of the spiral inductors.

Furthermore, if the layout allows, the elements other than the spiral inductors may be preferably formed in the underlying region of the spiral inductors which does not include the underlying regions of the inner areas of the innermost conductor trace turns of the spiral inductors.

Figure 5:
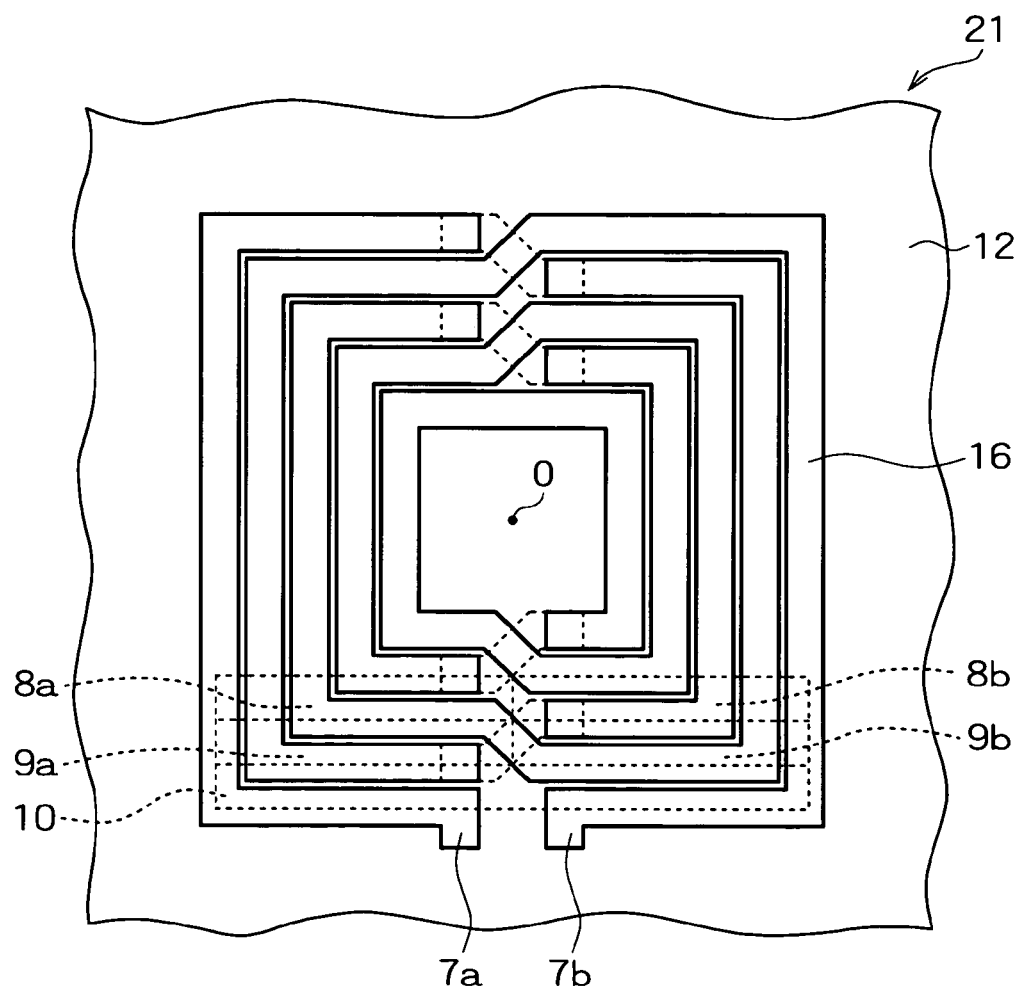
FIG. 5 is a plan view showing a voltage controlled oscillator according to a second embodiment of the present invention.

Now, a second embodiment of the present invention will be described below. FIG. 5 is a plan view showing a voltage controlled oscillator according to this embodiment. As shown in FIG. 5, an LC-VCO 21 according to this embodiment has a layout different from that of the aforementioned LC-VCO 1 according to the first embodiment (see FIG. 3). The circuit configuration of the LC-VCO 21 according to this embodiment is identical to that of the conventional LC-VCO 101 shown in FIG. 1.

As shown in FIG. 5, the LC-VCO 21 is provided with one full-symmetric inductor 16 in the topmost layer of a multilayer conductor trace stack 12 instead of the two spiral inductors 6a and 6b provided in the LC-VCO 1 according to the first embodiment. The full-symmetric inductor 16 has two spiral inductors, which are nested alternately and interconnected at the innermost turn, and is formed with a total of five turns of wirings in rectangular shapes, for example.

A varactor element formed region in which the varactor elements 8a and 8b are formed is located in the underlying region of the full-symmetric inductor 16 on the surface of the semiconductor substrate, the region excluding the center axis O of the full-symmetric inductor 16. A transistor formed region in which the N-channel transistors 9a, 9b, and 10 are formed is also positioned adjacent to the varactor element formed region. This transistor formed region is also positioned in the underlying region which underlies the full-symmetric inductor 16 and does not include the center axis O thereof. The configuration and operation of the LC-VCO 21 according to this embodiment other than those mentioned above are identical to those of the LC-VCO 1 according to the aforementioned first embodiment.

This embodiment allows for providing a less layout area for the LC-VCO as compared with the aforementioned first embodiment. For example, the LC-VCO 21 according to this embodiment has a rectangular layout of a 150 μm vertical side and a 150 μm horizontal side. The effects other than those described above according to this embodiment are identical to those of the aforementioned first embodiment.

What is claimed is:

1. A semiconductor integrated circuit device, comprising a substrate, a multilayer interconnection layer deposited on said substrate, and a voltage controlled oscillator incorporated into said semiconductor integrated circuit device, said voltage controlled oscillator comprising:
   output terminals;
   spiral inductors deposited in said multilayer interconnection layer and connected to said output terminals;
   variable capacitors formed in said multilayer interconnection layer, in a region directly underlying said spiral inductors, but without underlying the center axes of said spiral inductors, said variable capacitors connected in parallel to said spiral inductors to form a resonant circuit in conjunction therewith; and
   a negative resistance section formed in said region, said negative resistance section connected to said resonant circuit and adapted for connection to a power supply, to supply current to said resonant circuit in sync with a resonant signal produced by the resonant circuit.

2. The semiconductor integrated circuit device according to claim 1, wherein said region excludes regions underlying inner areas of the innermost conductor trace turns of said spiral inductors.

3. The semiconductor integrated circuit device according to claim 1, wherein center axes of said spiral inductors pass through only said substrate and interlayer insulating layers of said multilayer interconnection layer.

4. The semiconductor integrated circuit device according to claim 1, further comprising:
   an invariable capacitor formed in said regions, said invariable capacitor being connected in parallel to said variable capacitors.

5. The semiconductor integrated circuit device according to claim 1, wherein said variable capacitors are varactor elements formed on a surface of said substrate.

6. The semiconductor integrated circuit device according to claim 1, further comprising a power supply including a high-potential line and a low-potential line, wherein:
   said negative resistance section is connected to said power supply,
   said output terminals comprises a first output terminal and a second output terminal,
   said spiral inductors and said variable capacitors are connected between said first output terminal and said second output terminal, and
   said negative resistance section comprises:
      a first N-channel transistor formed on a surface of said substrate, said first N- channel transistor having a source connected to said low-potential line, a drain connected to said first output terminal, and a gate connected to said second output terminal, and
      a second N-channel transistor formed on the surface of said substrate, said second N-channel transistor having a source connected to said low-potential line, a drain connected to said second output terminal, and a gate connected to said first output terminal.

7. The semiconductor integrated circuit device according to claim 1, wherein said spiral inductor comprises a full-symmetric inductor.

8. The semiconductor integrated circuit device according to claim 1, wherein said voltage controlled oscillator comprises a local oscillator in a phase locked loop circuit.

9. The semiconductor integrated circuit device according to claim 1, wherein:
   said spiral inductors are deposited at a first level in said multilayer interconnection layer, and
   said variable capacitors and said negative resistance section are formed at a second level in said multilayer interconnection layer.

10. The semiconductor integrated circuit device according to claim 1, wherein:
    said spiral inductors are deposited on a surface of a first layer of said multilayer interconnection layer, and
    said variable capacitors and said negative resistance section are formed on a surface of a second layer of said multilayer interconnection layer.

11. A semiconductor integrated circuit device, comprising a substrate, a multilayer interconnection layer deposited on said substrate, and a voltage controlled oscillator incorporated into said semiconductor integrated circuit device, said voltage controlled oscillator comprising:
    output terminals;
    spiral inductors deposited in said multilayer interconnection layer and connected to said output terminals;
    variable capacitors formed in a region which includes the region directly underlying said spiral inductors but does not include the center axes of said spiral inductors, and connected in parallel to said spiral inductors to form a resonant circuit in conjunction therewith;
    a negative resistance section formed in said region and connected between said resonant circuit and a power supply to supply currents to said resonant circuit in sync with a resonant signal produced by the resonant circuit; and
    an invariable capacitor formed in said region, said invariable capacitor being connected in parallel to said variable capacitors.

12. A semiconductor integrated circuit device, comprising a substrate, a multilayer interconnection layer deposited on said substrate, and a voltage controlled oscillator incorporated into said semiconductor integrated circuit device, said voltage controlled oscillator comprising: output terminals;
    spiral inductors deposited in said multilayer interconnection layer and connected to said output terminals;
    variable capacitors formed in a region which includes the region directly underlying said spiral inductors but does not include the center axes of said spiral inductors, and connected in parallel to said spiral inductors to form a resonant circuit in conjunction therewith;
    a negative resistance section formed in said region and connected between said resonant circuit and a power supply to supply currents to said resonant circuit in sync with a resonant signal produced by the resonant circuit; and
    said negative resistance section is connected to said power supply,
    said output terminals comprises a first output terminal and a second output terminal,
    said spiral inductors and said variable capacitors are connected between said first output terminal and said second output terminal, and
    said negative resistance section comprises:
       a first N-channel transistor formed on a surface of said substrate, said first N- channel transistor having a source connected to said low-potential line, a drain connected to said first output terminal, and a gate connected to said second output terminal, and a second N-channel transistor formed on the surface of said substrate, said second N-channel transistor having a source connected to said low-potential line, a drain connected to said second output terminal, and a gate connected to said first output terminal.

13. A semiconductor integrated circuit device, comprising a substrate, a multilayer interconnection layer deposited on said substrate, and a voltage controlled oscillator incorporated into said semiconductor integrated circuit device, said voltage controlled oscillator comprising:

output terminals;

spiral inductors deposited in said multilayer interconnection layer and connected to said output terminals;

variable capacitors formed in said multilayer interconnection layer, directly underlying said spiral inductors, but without underlying the center axes of said spiral inductors, said variable capacitors connected in parallel to said spiral inductors to form a resonant circuit in conjunction therewith; and a negative resistance section formed in said multilayer interconnection layer, underlying said spiral inductors, but without underlying the center axes of said spiral inductors, said negative resistance section connected to said resonant circuit and adapted for connection to a power supply.

14. The semiconductor integrated circuit device according to claim 13, wherein said variable capacitors and said negative resistance section do not underlie inner areas of the innermost conductor trace turns of said spiral inductors.

15. The semiconductor integrated circuit device according to claim 13, wherein center axes of said spiral inductors pass through only said substrate and interlayer insulating layers of said multilayer interconnection layer.

16. The semiconductor integrated circuit device according to claim 13, further comprising:

an invariable capacitor underlying said spiral inductors, but without underlying the center axes of said spiral inductors, said invariable capacitor being connected in parallel to said variable capacitors.

17. The semiconductor integrated circuit device according to claim 13, wherein said variable capacitors are varactor elements formed on a surface of said substrate.

18. The semiconductor integrated circuit device according to claim 13, further comprising a power supply including a high-potential line and a low-potential line, wherein:

said output terminals comprises a first output terminal and a second output terminal, said spiral inductors and said variable capacitors are connected between said first output terminal and said second output terminal, and said negative resistance section comprises:

a first N-channel transistor formed in said multilayer interconnection layer, said first N-channel transistor having a source connected to said low-potential line, a drain connected to said first output terminal, and a gate connected to said second output terminal, and a second N-channel transistor formed in said multilayer interconnection layer, said second N-channel transistor having a source connected to said low-potential line, a drain connected to said second output terminal, and a gate connected to said first output terminal.

19. The semiconductor integrated circuit device according to claim 13, wherein said spiral inductor comprises a full-symmetric inductor.

20. The semiconductor integrated circuit device according to claim 13, wherein said voltage controlled oscillator comprises a local oscillator in a phase locked loop circuit.

21. The semiconductor integrated circuit device according to claim 13, wherein:

said spiral inductors are deposited at a first level in said multilayer interconnection layer, and said variable capacitors and said negative resistance section are formed at a second level in said multilayer interconnection layer.

22. The semiconductor integrated circuit device according to claim 13, wherein:

said spiral inductors are deposited on a surface of a first layer of said multilayer interconnection layer, and said variable capacitors and said negative resistance section are formed on a surface of a second layer of said multilayer interconnection layer.

* * * * *